United States Patent
Ni et al.

(10) Patent No.: US 11,871,540 B2
(45) Date of Patent: Jan. 9, 2024

(54) OPTIMIZING WASTE HEAT RECOVERY AND RETURN WATER TEMPERATURE USING DYNAMIC FLOW CONTROL BASED ON SERVER POWER PROFILES AND COOLING CAPACITY OF SERVERS

(71) Applicant: Lenovo Enterprise Solutions (Singapore) Pte. Ltd., New Tech Park (SG)

(72) Inventors: Chunjian Ni, Research Triangle Park, NC (US); Vinod Kamath, Research Triangle Park, NC (US); Jeffrey Scott Holland, Research Triangle Park, NC (US); Bejoy Jose Kochuparambil, Research Triangle Park, NC (US); Andrew Thomas Junkins, Research Triangle Park, NC (US); Paul Artman, Research Triangle Park, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 535 days.

(21) Appl. No.: 17/187,242

(22) Filed: Feb. 26, 2021

(65) Prior Publication Data
US 2022/0276683 A1    Sep. 1, 2022

(51) Int. Cl.
H05K 7/20 (2006.01)
G06F 11/30 (2006.01)

(52) U.S. Cl.
CPC ..... *H05K 7/20281* (2013.01); *G06F 11/3062* (2013.01); *H05K 7/20836* (2013.01)

(58) Field of Classification Search
None
See application file for complete search history.

(56) References Cited

U.S. PATENT DOCUMENTS

| | | | |
|---|---|---|---|
| 2013/0205822 A1* | 8/2013 | Heiland | G01M 3/04 62/259.2 |
| 2014/0040899 A1* | 2/2014 | Chen | G06F 9/5094 718/102 |

* cited by examiner

*Primary Examiner* — Eric C Wai
(74) *Attorney, Agent, or Firm* — Olive Law Group, PLLC

(57) ABSTRACT

Method, system, and computer program product embodiments of heating a flow of liquid by transfer of heat with computing devices. Embodiments also include determining a dynamic cooling capacity index for each of the computing devices, and allocating processing workload among the first computing device and the second computing device based on the dynamic cooling capacity indexes of the computing devices. Embodiments further include allocating workload and/or regulating flow rate of the flow of liquid to maintain a predetermined value or range of values of temperature of the liquid.

18 Claims, 6 Drawing Sheets

OPTIMIZING WASTE HEAT RECOVERY AND RETURN WATER TEMPERATURE USING DYNAMIC FLOW CONTROL BASED ON SERVER POWER PROFILES AND COOLING CAPACITY OF SERVERS

TECHNICAL FIELD

The presently disclosed subject matter relates generally to methods and systems for cooling electronic devices with a flow of cooling liquid and for allocating workload for the electronic devices. Particularly, the presently disclosed subject matter relates to systems and methods for cooling computing devices and allocating workloads for the devices based on operating conditions and characteristics of the devices.

SUMMARY

The presently disclosed subject matter includes systems and methods for optimizing waste heat recovery and return water temperature using dynamic flow control based on server power profiles and cooling capacity of servers.

According to an aspect, a method includes heating a flow of liquid by transfer of heat with computing devices. The method also includes determining a dynamic cooling capacity index for each of the computing devices. Further, the method includes allocating processing workload among the first computing device and the second computing device based on the dynamic cooling capacity indexes of the computing devices.

According to another aspect, a computer program product includes a computer readable storage medium having computer readable program code embodied therewith. Further, the computer readable program code comprises code configured to heat a flow of liquid by transfer of heat with a first computing device and a second computing device. Further, the computer readable program code comprises code configured to determine a first dynamic heat transfer capacity index for the first computing device. Further, the computer readable program code comprises code configured to determine a second dynamic heat transfer capacity index for the second computing device. Further, the computer readable program code comprises code configured to allocate processing workload among the first computing device and the second computing device based on the first DCCI and second DCCI.

BRIEF DESCRIPTION OF THE DRAWINGS

Figure 1:
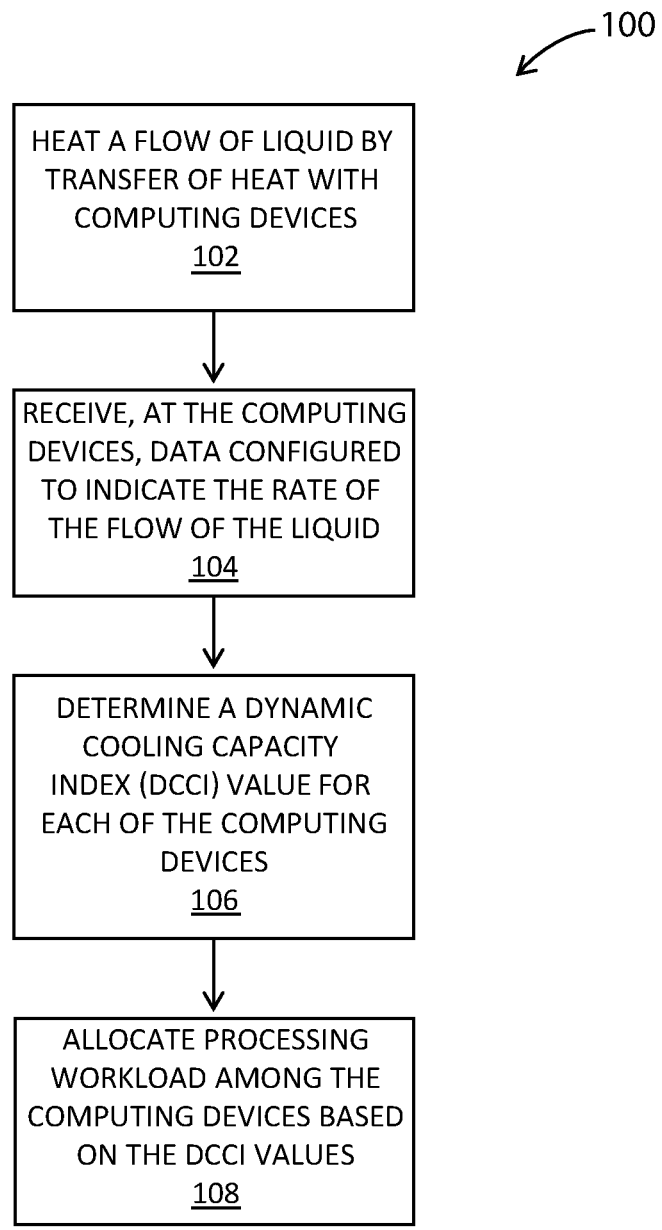
Figure 2:
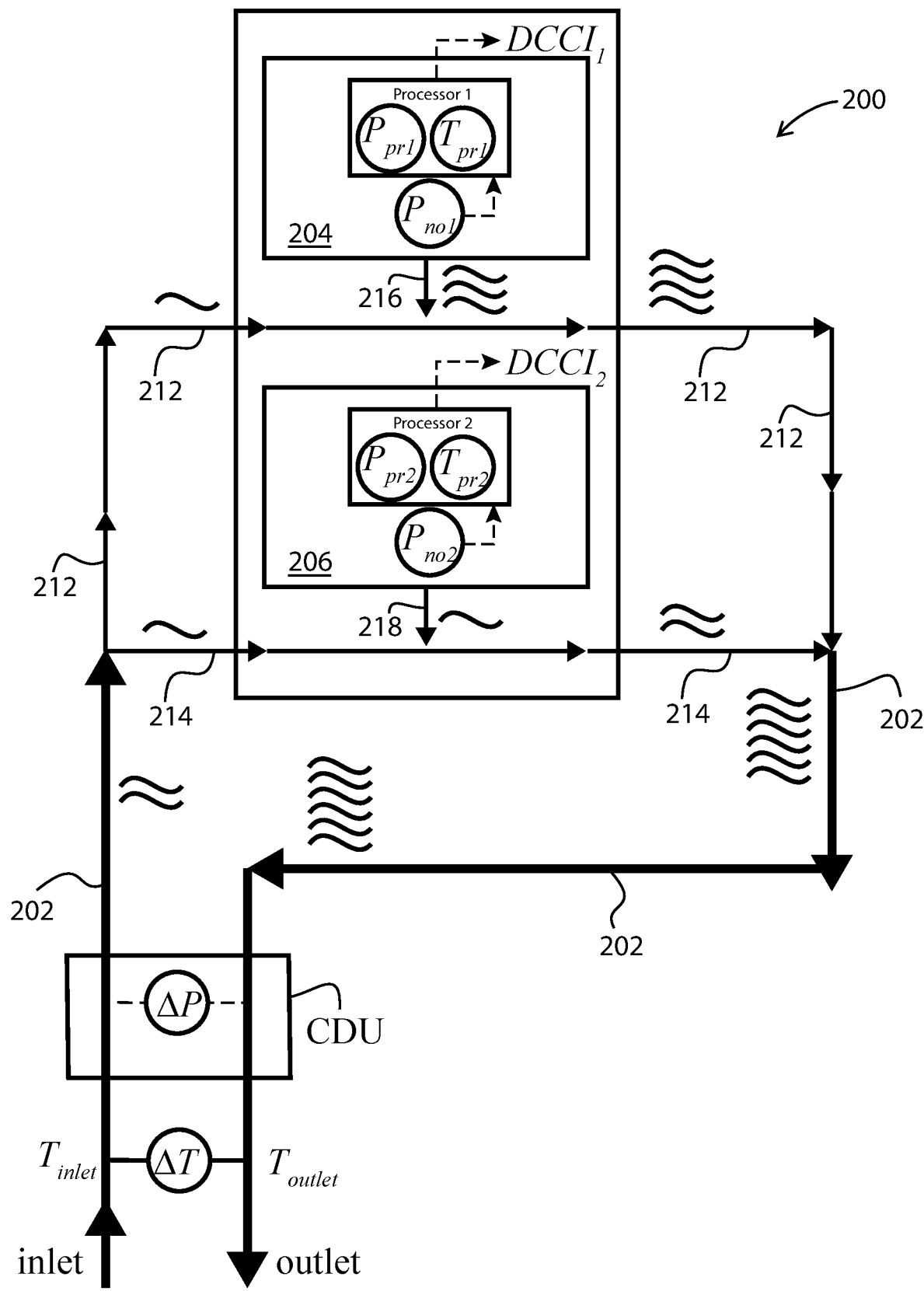
Figure 3:
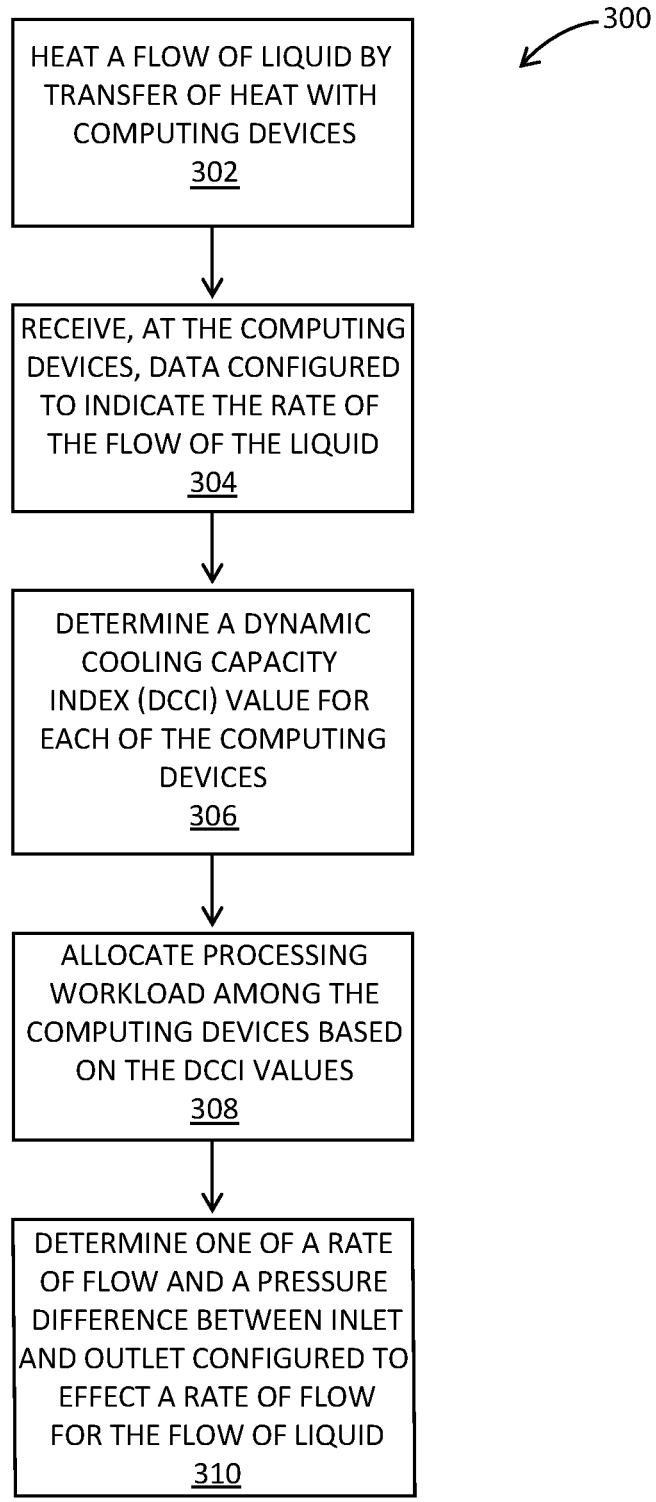
Figure 4:
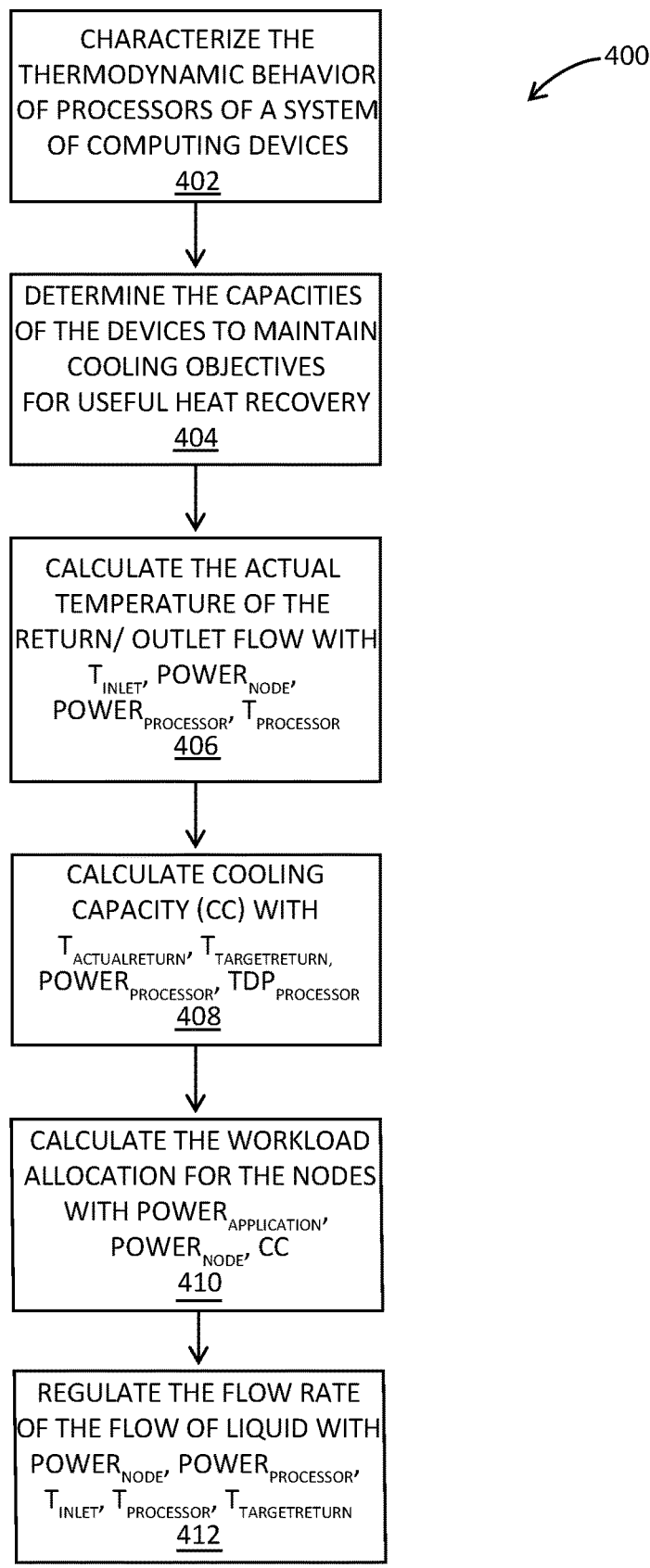
Figure 5:
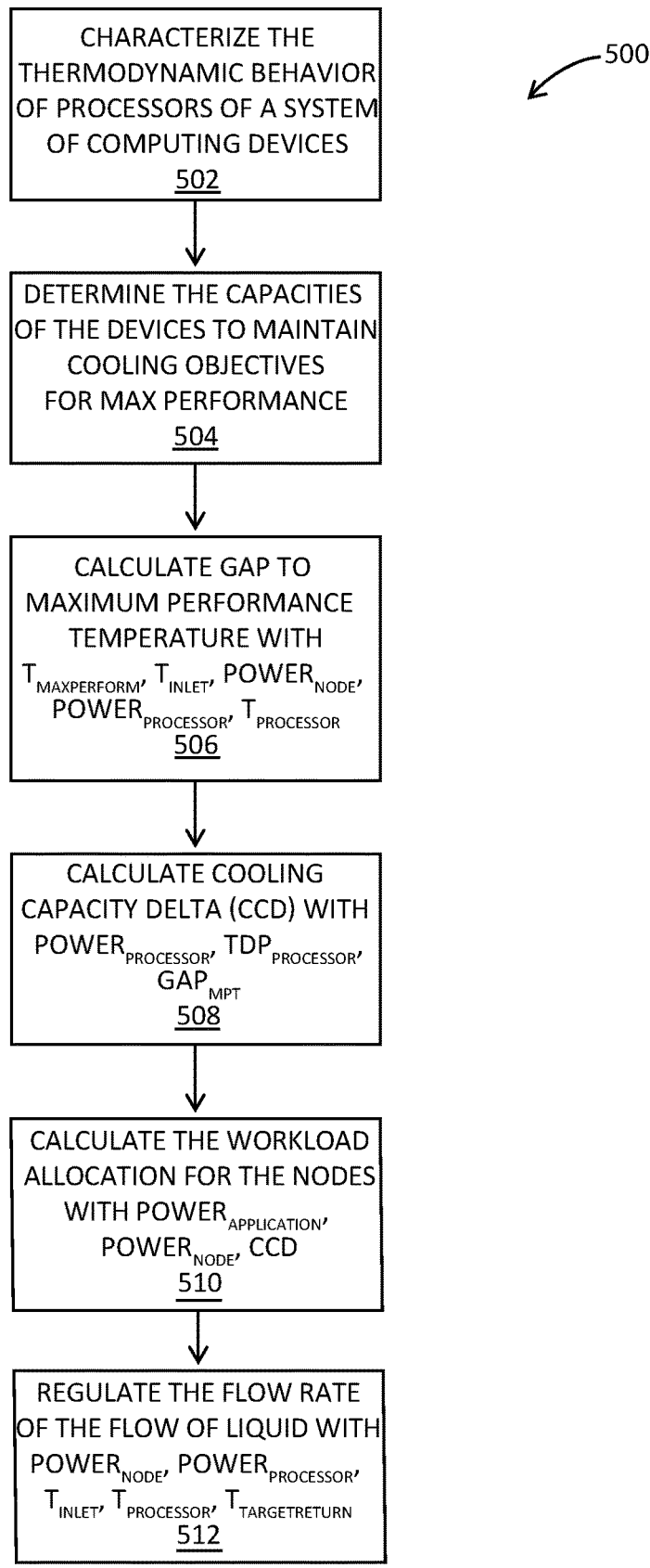
Figure 6:
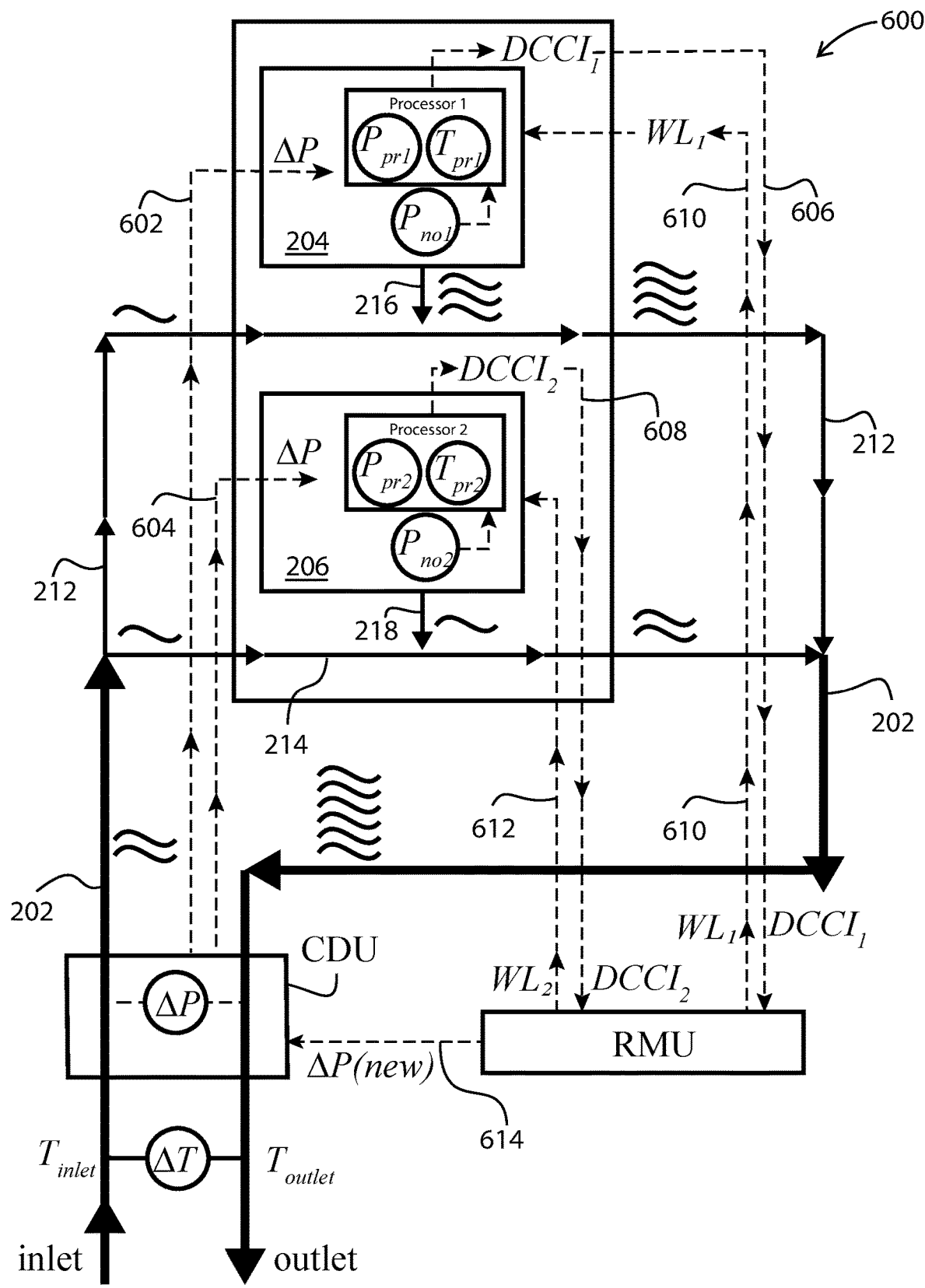

Having thus described the presently disclosed subject matter in general terms, reference will now be made to the accompanying Drawings, which are not necessarily drawn to scale, and wherein:

FIG. 1 is a flow chart of a method for allocating processing workload among computing devices configured to heat a flow of liquid based on capacity to transfer heat to the liquid in accordance with embodiments of the present disclosure;

FIG. 2 is a block diagram of a system for heating a flow of liquid with plural computing devices in accordance with embodiments of the present disclosure;

FIG. 3 is another flow chart of a method for allocating processing workload among computing devices configured to heat a flow of liquid based on capacity to transfer heat to the liquid in accordance with embodiments of the present disclosure;

FIG. 4 is another flow chart of a method for allocating processing workload among computing devices configured to heat a flow of liquid based on capacity to transfer heat to the liquid for useful heat recovery in accordance with embodiments of the present disclosure;

FIG. 5 is another flow chart of a method for allocating processing workload among computing devices configured to heat a flow of liquid based on capacity to transfer heat to the liquid for maximum performance in accordance with embodiments of the present disclosure; and FIG. 6 is another block diagram of a system for heating a flow of liquid with plural computing devices and with a rack management unit, in accordance with embodiments of the present disclosure.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Unless otherwise defined, all technical terms used herein have the same meaning as commonly understood by one of ordinary skill in the art to which this disclosure belongs.

FIG. 1 is a flowchart of an exemplary method of cooling a plurality of computing devices. FIG. 1 shows a method 100, comprising: a step 102 of heating a flow of liquid by transfer of heat with a first computing device and a second computing device; a step 104 of receiving, at the computing devices, data configured to indicate the rate of the flow of the liquid; A step 106 of determining a first dynamic cooling capacity index (DCCI) for the first computing device and determining a second dynamic cooling capacity index for the second computing device; and A step 108 of allocating processing workload among the first computing device and the second computing device based on the first DCCI and second DCCI.

FIG. 2 is a diagram of an exemplary embodiment of a liquid cooling system comprising a plurality of computing devices, in accordance with the present invention. FIG. 2 shows a system 200, comprising a flow of liquid 202, a first computing device 204 and a second computing device 206. There is a first dynamic cooling capacity index $DCCI_1$ for the first computing device 204, and a second dynamic cooling capacity index $DCCI_2$ for the second computing device 206. The flow of liquid 202 comprises a first computing device flow 212 and a second computing device flow 214. The first computing device 204 is in heat transfer interface with the first computing device flow of liquid 212, transferring heat 216 to the flow 212, and the second computing device 206 is in heat transfer interface with the second computing device flow of liquid 214, contributing heat 218 to the flow 214.

The present invention contemplates other embodiments comprising different arrangements of components, and the system 200 is merely exemplary of one arrangement configured to operate according to a method of allocating processing workload among the first computing device 204 and the second computing device 206 based on a dynamic cooling capacity index, such as the first DCCI ($DCCI_1$) and second DCCI ($DCCI_2$).

Further, FIG. 2 indicates several metrics understood by the system 200 and/or computing devices 204, 206 that are pertinent to several exemplary method embodiments of the present invention. The flow of liquid 202 comprises an inlet temperature $T_{inlet}$ and an outlet temperature $T_{outlet}$. Several exemplary method embodiments of the present invention contemplate allocating workload with respect to the values of these temperatures $T_{inlet}$, $T_{outlet}$. For example, embodiments comprise at least one embodiment comprising a step of allocating workload to maintain at least a minimum temperature difference (ΔT) between the inlet temperature $T_{inlet}$ and outlet temperature $T_{outlet}$.

Embodiments also comprise at least one embodiment comprising a step of allocating workload to maintain at least a minimum value of outlet flow temperature $T_{outlet}$. For example, in at least one contemplated method embodiment, the flow of liquid 202 is controlled such that the method effects a minimum outlet flow temperature $T_{outlet}$ in a range selected from 54-58 degrees Celsius.

Each of the computing devices 204, 206 also comprise and/or are configured to determine and/or monitor values of several variables of its operating state: Processor Temperature ($T_{processor}$ (specifically $T_{pr1}$, $T_{pr2}$)), Processor Power ($Power_{processor}$ (specifically labels $P_{per1}$, $P_{per2}$)), and Node Power ($Power_{node}$ (specifically labels $P_{No1}$, $P_{no2}$)). The flow 204 also comprises a Pressure gradient ΔP, here shown as the difference in flow pressure at the inlet $P_{inlet}$ and flow pressure at the outlet $P_{outlet}$. In at least one contemplated method embodiment of the present invention, several ΔP values are respectively associated with a particular value for rate of flow for the flow of liquid 202.

In addition to variables monitored and determined by the computing devices 204, 206, exemplary method embodiments, in accordance with the present invention, contemplate ones which use these values to control systems similar to that of system 200. At least one embodiment comprises a step of determining a rate of flow for the flow of liquid 202 based on the power consumption levels ($P_{pr1}$, $P_{pr2}$, $P_{no1}$, $P_{no2}$) of the computing devices 204, 206. At least one embodiment comprises a step of determining for the flow of liquid 202 a value for pressure difference ΔP between the inlet flow and outlet flow, based on the power consumption levels ($P_{pr1}$, $P_{pr2}$, $P_{no1}$, $P_{no2}$) of the computing devices 204, 206.

Another exemplary embodiment in accordance with the present invention contemplates control of allocation of workloads among computing devices of systems similar to that of system 200. For example, several exemplary method embodiments comprise a step of allocating an amount of workload to the first computing device 204 and not allocating the amount of workload to the second computing device 206, while the first index $DCCI_1$ is greater than the second index $DCCI_2$. For at least one exemplary method embodiment of the present invention, allocating the amount of workload comprises steps of determining the instant power consumption, either or both of $Power_{processor}$ or $Power_{node}$ or other power metric for each of the devices 204, 206 and determining the instant flow rate of the flow of liquid 202, and/or for each of the devices (204, 206), respectively (flows 212, 214).

Referring now to FIG. 3, FIG. 3 is a flowchart of an exemplary method of cooling a plurality of computing devices, Similar to that of FIG. 1, FIG. 3 shows a method 300, comprising: a step 302 of heating a flow of liquid by transfer of heat with a first computing device and a second computing device; a step 304 of receiving, at the computing devices, data configured to indicate the rate of the flow of the liquid; a step 306 of determining a first dynamic cooling capacity index (DCCI) for the first computing device and determining a second dynamic cooling capacity index for the second computing device; and a step 308 of allocating processing workload among the first computing device and the second computing device based on the first DCCI and second DCCI.

FIG. 3 further comprises a step 310 of determining one of a rate of flow and a pressure difference (ΔP, see FIG. 2) between an inlet and outlet ($P_{inlet}$, $P_{outlet}$, see FIG. 2), configured to effect a rate of flow for the flow of liquid (202, See FIG. 2). For example, an embodiment of another system, similar to that shown in FIG. 2 may be operable by the method as described above and shown in FIG. 3.

By monitoring and by calculation of values of the above variables, with respect to plural computing devices (see 204, 206, FIG. 2) configured to monitor and calculation of these values, such a system would thereby be configured to both allocate workload based on DCCI values (see $DCCI_1$, $DCCI_2$, FIG. 2) as well as control rate of liquid flow through the system. Therefore, system 300 has advantages in energy consumption per computing device with respect to processing capacity per computing power usage, energy consumption with respect to energy required to provide an optimal flow rate for the flow of liquid, as well as provide at least one of a desirable amount of heat carried in the outlet flow from the system and/or temperature of such an outlet/return flow ($T_{outlet}$).

FIGS. 4 and 5 relate to exemplary embodiments of methods for using cooling capacity indexes for a computing device to calculate workload allocation and/or regulate flow rate of a cooling flow of liquid for a liquid-cooled computing device. In both of FIGS. 4 and 5, the methods contemplate computing devices that each comprise a predetermined power level and an instant power consumption. Further, each comprises at least one step of determining the indexes that comprises a function of the instant power consumption and the predetermined power level for each of the devices, respectively. In the depicted embodiments, as well as in other exemplary embodiments, determining the indexes comprises selecting values that are configured to represent the instant capacity for each of the computing devices, respectively, to dissipate additional processing power into heat in the flow of liquid, from a range of values comprising a full cooling capacity value and a zero cooling capacity value.

Referring now to FIG. 4, FIG. 4 is a flowchart of an exemplary method of cooling a plurality of computing devices. FIG. 4 shows a method 400, comprising: a step 402 of characterizing, for a system of computing devices (here, "devices" comprises computing nodes that each have at least one processor), the thermodynamic behavior of the processors. For example, during a "design phase" of a system of such devices, characterizing processors for their performance and efficiency and other parameters, determined a priori and/or additionally by observation under a set of operating burdens.

The method 400 further comprises a step 404 of determining the capacities of the devices to maintain cooling objectives for useful heat recovery. Specifically, for this method, useful heat recovery is presumed to be approximated by maximizing the return temperature $T_{actualreturn}$ of flow of liquid in the system. $T_{actualreturn}$ for purposes of this figure may refer to either of the net outlet temperature of such a system (see $T_{outlet}$, FIG. 2) or the exiting flow temperature from a computing device (see first and second computing device flow of liquid(s) 212, 214, FIG. 2).

FIG. 4 further shows that the method 400 comprises at least three steps (here, steps 406, 408, and 410), amounting to a functional form that correlates several parameters.

Step 406 calculates the actual temperature of the return or outlet flow of the flow of liquid in the system ($T_{actualreturn}$). $T_{actualreturn}$ is a function comprising as inputs: The temperature of the flow of cooling liquid or fluid at the inlet ($T_{inlet}$), the power consumption of the particular computing device or node (Power$_{node}$), the power consumption of the particular processor, of the node (Power$_{processor}$), and the temperature of the processor ($T_{processor}$). Expressed as a formula:

$$T_{actualreturn} = f(T_{inlet}, \text{Power}_{node}, \text{Power}_{processor}, T_{processor})$$

Step 408 calculates the computing capacity of the computing device or node. Compute Capacity ("CC") may otherwise be referred to as a Dynamic Cooling Capacity Index, as it is a time-instance value indicating the instant relative amount of cooling capacity specific to a computing device, relative to a peak or optimum value. Here, this DCCI, CC, is a function comprising as inputs: $T_{actualreturn}$ (from step 406), a predetermined or otherwise identified target temperature for the return or outlet flow of the flow of liquid in the system ($T_{targetreturn}$), the power consumption of the particular processor(s) of the node (Power$_{processor}$), and the thermal design power level or other value for the particular processor (TDP$_{processor}$). Expressed as a formula:

$$CC = f(T_{actualreturn}, T_{targetreturn}, \text{Power}_{processor}, TDP_{processor})$$

Step 410 calculates a workload allocation for the node. Workload allocation (WA), which is not limited to any particular unit of calculations or energy levels, is a function of the Application power (Power$_{application}$), which may represent either the actual or a projected amount of power necessary to run an application, Power$_{node}$, and Compute Capacity (CC, from step 408). Expressed as a formula:

$$WA = f(\text{Power}_{application}, \text{Power}_{node}, CC)$$

At this point, a system or the computing devices of such a system performing these steps is configured to process a specific amount of workload by allocating the amounts for each computing device, according to the instant values of computing capacity. Exemplary embodiments include method embodiments which then operate in a loop without the remaining steps shown in FIG. 4, but the present embodiment continues with steps configured to facilitate controlling a system to effect a particular flow rate for the flow of liquid through such a system.

FIG. 4 further shows that method 400 includes a step 412 to regulate the flow rate of the flow of liquid. Here, target flow rate (flow$_{target}$) is a function, comprising (as inputs): the temperature of the flow of liquid or fluid at the inlet (T and previously discussed Power$_{node}$, Power$_{processor}$, T$_{processor}$, and T$_{targetreturn}$ (step 406). Expressed as a formula:

$$\text{flow}_{target} = f(T_{inlet}, \text{Power}_{node}, \text{Power}_{processor}, T_{processor}, T_{targetreturn})$$

Applying method 400 to a system similar to system 200 (FIG. 2) renders the system capable of performing workload allocation as a process that is capable of being adjusted rapidly, on the scale of computer processing cycle speeds. Meanwhile, adjusting flow rate, even though calculation of a target flow rate can be done rapidly, is subject to the response speed and other parameters of the mechanical equipment that provide and control the flow of liquid to the system and/or its computing devices, orders of magnitude more slowly than workload allocation.

For such a system (one similar to system 200), because of the disparity in these rates of adjustment and frequency of making significant changes, adjusting workload would appear to be upstream of the logic that would adjust flow rate, as the former executes on the scale of milliseconds, and the latter is on the scale of whole seconds. It might appear that adjusting flow rate would be something that would only occur when workload allocation changes were not necessary, but this is not strictly true. It may in fact be the case that under circumstances typical to any particular instance of the system, that such a system makes its most notable changes in flow rate when the system is operating optimally, such as the functions of the system dictating that the flow rate change.

For example, consider a system operating under circumstances where the values of $T_{actualreturn}$ are tracking closely to $T_{targetreturn}$, and where Power$_{processor}$ is at a value, relative to TDP$_{processor}$ that Compute Capacity (for each of the computing nodes) has reached a level at which the system will not result in significant changes in Compute Capacity. For steady values of Power$_{application}$ and Power$_{node}$, WA may be expected to also not change significantly.

However, serial behavior of workload allocation (WA) changing before flow rate changing is not strictly required of method 400, nor for other contemplated exemplary embodiments not depicted here, because flow$_{target}$ is a function comprising values concerning the temperatures of the fluid and the power and temperature values of the node and processor, but not Compute Capacity. It simply may or may not be the case that those particular values and changes of these variables, which have resulted in a state that does not cause changes in workload allocation, are ones that also cause the flow$_{target}$ function to fluctuate in value. However, it is the scale of human time-observation and the greater tangibility of a relatively steady change in a scalar value like one representing the overall-system-level-flow-rate that would seem to make flow rate something which changes only when work allocation seems to be unchanging or unnecessary.

Referring now to FIG. 5, FIG. 5 is a flowchart of an exemplary method of cooling a plurality of computing devices. FIG. 5 shows a method 500, comprising: a step 502 of characterizing the thermodynamic behavior of the processors (similar to that of step 402, see FIG. 4), and a step 504 of determining the capacities of the devices to maintain cooling objectives for maximum performance (computing performance). Specifically, for this method 500, maximum performance is presumed to be approximated by operating with respect to Tuned Operating Silicon Junction Temperature (TOJT) or Maximum Performance Temperature.

FIG. 5 further shows that the method 500 comprises at least three steps (here, steps 506, 508, and 510), amounting to a functional form that correlates several parameters.

Step 506 calculates a gap-to-maximum-performance temperature ($Gap_{MPT}$) metric. $Gap_{MPT}$ is a function comprising as inputs: The temperature of maximum performance ($T_{maxperformance}$), the temperature of the flow of cooling liquid or fluid at the inlet ($T_{inlet}$), the power consumption of the particular computing device or node ($Power_{node}$), the power consumption of the particular processor, of the node ($Power_{processor}$), and the temperature of the processor ($T_{processor}$). Expressed as a formula:

$$Gap_{MPT}=f(T_{maxperformance}, T_{inlet}, Power_{node}, Power_{processor}, T_{processor})$$

Step 508 calculates the difference in computing capacity of the computing device or node between the instant state and the compute capacity at maximum performance temperature ("Compute Capacity Delta" or CCD). CCD may otherwise be referred to as a Dynamic Cooling Capacity Index, as it is a time-instance value indicating the instant relative amount of cooling capacity specific to a computing device, relative to a peak or optimum value. Here, this DCCI, CCD, is a function comprising as inputs: the power consumption of the particular processor(s) of the node ($Power_{processor}$), the thermal design power level or other value for the particular processor ($TDP_{processor}$), and $Gap_{MPT}$ (from step 506). Expressed as a formula:

$$CCD=f(Power_{processor}, TDP_{processor}, Gap_{MPT})$$

Step 510 calculates a workload allocation for the node. Workload allocation (WA), which is not limited to any particular unit of calculations or energy levels, is a function of the application power ($Power_{application}$), which may represent either the actual or a projected amount of power necessary to run an application, $Power_{node}$, and Compute Capacity Delta, CCD, (from step 508).

$$WA=f(Power_{application}, Power_{node}, CCD)$$

FIG. 5 further shows that method 500 includes a step 512 (similar to step 412 of method 400) to regulate the flow rate of the flow of liquid. Here, target flow rate ($flow_{target}$) is a function, comprising (as inputs): the temperature of the flow of liquid or fluid at the inlet ($T_{inlet}$), and previously discussed $Power_{node}$, $Power_{processor}$, $T_{processor}$, and $T_{targetreturn}$ (step 406). Expressed as a formula:

$$flow_{target}=f(T_{inlet}, Power_{node}, Power_{processor}, T_{processor}, T_{targetreturn})$$

Applying method 500 to a system similar to system 200 (FIG. 2) renders the system capable of performing workload allocation as a process that is capable of being adjusted rapidly, on the scale of computer processing cycle speeds. Meanwhile, adjusting flow rate, even though calculation of a target flow rate can be done rapidly, is subject to the response speed and other parameters of the mechanical equipment that provide and control the flow of liquid to the system and/or its computing devices, orders of magnitude more slowly than workload allocation.

For such a system (one similar to system 200), because of the disparity in these rates of adjustment and frequency of making significant changes, adjusting workload would appear to be upstream of the logic that would adjust flow rate, as the former executes on the scale of milliseconds, and the latter is on the scale of whole seconds. It might appear that adjusting flow rate would be something that would only occur when workload allocation changes were not necessary, but this is not strictly true. It may in fact be the case that under circumstances typical to any particular instance of the system, that such a system makes its most notable changes in flow rate when the system is operating optimally, such that the functions dictating the new flow rate change.

For example, consider a system operating under circumstances where the values of $T_{processor}$ are tracking closely to $T_{maxperformance}$, and where $Power_{processor}$ is at a value, relative to $TDP_{processor}$ that Compute Capacity Delta (for each of the computing nodes) has reached a level at which the system will not result in significant changes in Compute Capacity Delta. For steady values of $Power_{application}$ and $Power_{node}$, WA may be expected to also not change significantly.

However, serial behavior of workload allocation (WA) changing before flow rate changing is not strictly required of method 500, nor for other contemplated exemplary embodiments not depicted here, because $flow_{target}$ is a function comprising values concerning the temperatures of the fluid and the power and temperature values of the node and processor, but not Compute Capacity Delta. It simply may be the case that those particular values and changes of these variables, which have resulted in a state that does not cause changes in Workload Allocation (WA), are ones that also cause the $flow_{target}$ function to fluctuate in value. However, it is the scale of human time-observation and the greater tangibility of a relatively steady change in a scalar value like one representing the overall-system-level-flow-rate that would seem to make flow rate something which changes only when work allocation seems to be unchanging or unnecessary.

FIG. 6 is a diagram of an exemplary embodiment of a liquid cooling system comprising a plurality of computing devices, in accordance with the present invention.

FIG. 6 shows a system 600, with several elements that are similar to those found in FIG. 2, comprising: a flow of liquid 202, a first computing device 204 and a second computing device 206. There is a first dynamic cooling capacity index $DCCI_1$ for the first computing device 204, and a second dynamic cooling capacity index $DCCI_2$ for the second computing device 206. The flow of liquid 202 comprises a first computing device flow 212 and a second computing device flow 214. The first computing device 204 is in heat transfer interface with the first computing device flow of liquid 212, transferring heat 216 to the flow 212, and the second computing device 206 is in heat transfer interface with the second computing device flow of liquid 214, contributing heat 218 to the flow 214.

System 600 is merely exemplary of one arrangement configured to operate according to a method of allocating processing workload among the first computing device 204 and the second computing device 206 based on a dynamic cooling capacity index, such as the first DCCI ($DCCI_1$) and second DCCI ($DCCI_2$). Unlike system 200, though, system 600 comprises a separate Rack Management Unit (RMU). The RMU allows for calculation of parameters of node and processor (or other computing device) performance to still be executed at the node-level, but provides communications between the nodes and the RMU. In this arrangement, the system 600 can effect control over flow rate for the flows of liquid (202, 212, 214) and workload allocation to plural computing devices with a rack-level device tasked with receiving data and values, performing comparison operations with these values, and communicating data and values back to the computing devices and to other components of the system.

Here, system 600 comprises a Coolant Distribution Unit (CDU) proximate the inlet and outlet of the flow of liquid 202 into and out-of the system 600.

The CDU is configured to control the flow rate of the flow of liquid 202 by monitoring and enforcing a particular value of $\Delta P$. Communication paths 602 and 604 communicate the instant $\Delta P$ value that is known to the CDU from the CDU to the first computing device 204 and second computing device 206, respectively.

Values of $\Delta P$ are understood by the each of the computing devices (204, 206), and/or the RMU, to correlate with a particular rate of flow for the computing device flows (212, 214) respectively. The receipt of these values is an analogous to steps 104 (see method 100, FIG. 1), and 304 (see method 300, FIG. 3).

The receipt of the value for $\Delta P$ enables the computing devices 204, 206 to identify the particular computing device flow rate 212, 214 pertinent to each computing device's respective calculations of outlet flow temperature.

For example, identification of the pertinent flow rate values, may be performed by accessing a database of values particular to the respective computing devices that was created as part of a design process of the system with specific components, such as one analogous to steps 402 of method 400 (See FIG. 4) and 502 of method 500 (see FIG. 5).

Analogously to steps 106, 306 (see FIG. 1, FIG. 3, respectively), the computing devices 204, 206 are configured to determine their respective DCCI values. After determination of the appropriate DCCI values, the computing devices 204, 206 are configured to communicate to the RMU via communications paths 606 and 608 the values determined by being identified (such as by steps similar to steps 402 and 404, FIG. 4; and 502 and 504, FIG. 5)—from or calculated (such as by steps similar to 408-410, FIG. 4 or 508-510, FIG. 5)—by the devices 204, 206. These are values for the variables respecting: the flow rate values, Power values ($Power_{processor}$, $Power_{node}$, $TDP_{processor}$, $Power_{application}$, etc.), Temperature values ($T_{actualreturn}$, $T_{inlet}$, $T_{processor}$, $T_{targetreturn}$, $T_{maxperformance}$, etc.) and DCCI values (such as CC, FIG. 4; CCD, FIG. 5).

Analogously to steps 108 and 308, the RMU is configured to receive the values via communications paths 606, 608 and determine an amount of workload for each of the computing devices 204, 206. Some exemplary ways to determine workload from such variables communicated via paths 606, 608 comprise steps similar to the calculations of workload WA of steps 410 (FIG. 4, for maximum useful heat recovery) and 510 (FIG. 5, for maximum performance). From these calculations or other determinations, the RMU is configured to identify a specific workload $WL_1$ and $WL_2$ for the computing devices 204, 206, respectively.

FIG. 6 further shows communications paths 610 and 612 from the RMU to the computing devices 204, 206. The RMU is thereby configured to communicate to the computing devices 204, 206 the workload values $WL_1$ and $WL_2$ for which those values were identified, respectively, above. The nature of the "amount" of workload represented by $WL_1$ and $WL_2$ is intentionally not depicted in FIG. 6.

For example, "workload allocation," may be a size or amount-by-units or quantification of a limit on allocation of workload, without identifying the tasks or containing data of any particular set of tasks and without reciting whether the actual substance of workloads are available to the computing devices without passing through the RMU.

As an alternative example, $WL_1$ and $WL_2$ may be an "amount" of workload insofar as each comprises the actual data and tasks of the workloads themselves, for each of the computing devices 204, 206 to thereafter process. The latter nature would suggest that the system passes the tasks of workload to the computing devices 204, 206 by a series of paths that passes through the RMU before the computing devices, and this should not necessarily be read-into FIG. 6, though it is a contemplated but merely exemplary alternative embodiment of the present invention.

Continuing with reference to FIG. 6, there is shown a communications path 614 from the RMU to the CDU for communication of a new $\Delta P$ value. As discussed above, the present invention comprises components and steps for associating flow rates with values for a variable representing a pressure gradient, such as $\Delta P$. Here, the RMU is configured to determine for either or both of the computing device flows 212, 214 or for overall system's flow of liquid 202 a new target flow rate, by a step analogous to steps 412 (FIG. 4) and 512 (FIG. 5) that result in a value for the "$flow_{target}$" variable. Having a new target flow rate, the RMU is further configured to determine or associate a value of $\Delta P$ that is tailored to effect the new flow rate, and to then communicate the flow rate value to the CDU via path 614.

It should be noted that the sequential appearance of the CDU-to-Computing-devices-to-RMU suggested by paths 602, 604, 606, and 608 is merely exemplary as part of the embodiment shown in FIG. 6, but should not be considered limiting on other embodiments. It is possible for embodiments to perform all calculations at the node-level, for example. These are conceptually easy to describe but more difficult to depict than the present diagram for FIG. 6.

For example, alternative embodiments comprise ones in which: an RMU is configured to receive temperature and pressure values from the CDU or otherwise receive such data without it being communicated to the computing devices before being relayed to the RMU; an RMU is configured to receive workload allocation calculations for each of the computing devices from the respective computing devices; there is no RMU and communications paths analogous to paths 606 and 608 are instead communications between the computing devices, such that the computing devices communicate with one another in order to allocate workload proportions and/or a new flow rate target to be dictated to the CDU (such as by a new $\Delta P$ value).

The above disclosure and referenced figures describe and depict steps of methods that contemplate execution of the steps with computing devices, for the control of computing devices and computer control of mechanisms and machines.

As such, the present invention contemplates embodiments in accordance with the present invention that are computer program products that use a computer readable storage medium having computer readable program code embodied therewith, where that code is configured to carry out steps similar to those which have been mentioned above.

For example, these exemplary computer program product embodiments comprise code that is configured to: heat a flow of liquid by transfer of heat with a first and second computing device, determine a first and second dynamic heat transfer capacity index for the respective first and second computing devices, and allocate processing workload among the first and second computing devices based on the respective DCCI values.

In accordance with embodiments, natural language understanding and processing may be utilized for generating description of an environment. Semantic mapping and ontology mapping can be used to disseminate relations of words and relatedness to an input. Example techniques may apply natural language understanding and artificial intelligence to understand concepts with an incomplete data corpus. FIG. 5 illustrates an example diagram showing the relation of different words for understanding an incomplete data corpus.

The present subject matter may be a system, a method, and/or a computer program product. The computer program product may include a computer readable storage medium (or media) having computer readable program instructions thereon for causing a processor to carry out aspects of the present subject matter.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a RAM, a ROM, an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present subject matter may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++, Javascript or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present subject matter.

Aspects of the present subject matter are described herein with reference to flowchart illustrations and/or block diagrams of methods, apparatus (systems), and computer program products according to embodiments of the subject matter. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A method comprising:
  heating a flow of liquid by transfer of heat with a first computing device and a second computing device, wherein the flow of liquid traverses from an inlet upstream from the first and second computing devices to an outlet downstream from the first and second computing devices;

determining a first dynamic cooling capacity index for the first computing device;

determining a second dynamic cooling capacity index for the second computing device; and allocating processing workload among the first computing device and the second computing device based on the first dynamic cooling capacity index and the second dynamic cooling capacity index, wherein allocating processing workload among the first computing device and the second computing device comprises allocating workload to maintain at least a minimum temperature difference between a temperature of the flow of liquid at the inlet and a temperature of the flow of liquid at the outlet.

2. The method of claim 1, wherein allocating processing workload among the first computing device and the second computing device comprises allocating workload to maintain at least a minimum value of the temperature of the flow of liquid at the outlet.

3. The method of claim 2, wherein the minimum value of the temperature of the flow of liquid at the outlet is in a range of 54-58 degrees Celsius.

4. The method of claim 1, further comprising:
determining power consumption levels of the first and second computing devices; and
controlling a rate of flow for the flow of liquid based on the power consumption levels of the first and second computing devices.

5. The method of claim 1, further comprising:
determining power consumption levels of the first and second computing devices; and
controlling a pressure difference between an inlet flow for the flow of liquid and an outlet flow for the flow of liquid based on the power consumption levels of the first and second computing devices.

6. The method of claim 1, wherein allocating processing workload among the first computing device and the second computing device comprises allocating an increased amount of workload to the first computing device based on the first index being greater than the second index.

7. The method of claim 1, wherein allocating processing workload among the first computing device and the second computing device comprises allocating processing workload further based on an instant power consumption for each of the first and second computing devices and an instant flow rate of the liquid for each of the first and second computing devices.

8. The method of claim 1, wherein the first and second dynamic cooling capacity indexes each comprise a function of an instant power consumption and a predetermined power level for the respective computing device.

9. The method of claim 1, wherein the first and second dynamic cooling capacity indexes are each configured to represent the instant capacity of the respective computing device to dissipate additional processing power into heat in the flow of liquid, from a range of values comprising a full cooling capacity value and a zero cooling capacity value.

10. A computer program product comprising:
a computer readable storage medium having computer readable program code embodied therewith, the computer readable program code configured to cause a computing system to perform operations comprising:
heating a flow of liquid by transfer of heat with a first computing device and a second computing device, wherein the flow of liquid traverses from an inlet upstream from the first and second computing devices to an outlet downstream from the first and second computing devices;

determining a first dynamic cooling capacity index for the first computing device;

determining a second dynamic cooling capacity index for the second computing device; and allocating processing workload among the first computing device and the second computing device based on the first dynamic cooling capacity index and the second dynamic cooling capacity index, wherein allocating processing workload among the first computing device and the second computing device comprises allocating workload to maintain at least a minimum temperature difference between an inlet temperature of the flow of liquid and an outlet temperature of the flow of liquid.

11. The computer program product of claim 10, wherein allocating processing workload among the first computing device and the second computing device comprises allocating workload to maintain at least a minimum value of the temperature of the flow of liquid at the outlet.

12. The computer program product of claim 11, wherein the minimum value of the temperature of the flow of liquid at the outlet is in a range of 54-58 degrees Celsius.

13. The computer program product of claim 10, wherein the operations further comprise:
determining power consumption levels of the first and second computing devices; and
controlling a rate of flow for the flow of liquid, based on the power consumption levels of the first and second computing devices.

14. The computer program product of claim 10, wherein the operations further comprise:
determining power consumption levels of the first and second computing devices; and
controlling a pressure difference between an inlet flow for the flow of liquid and an outlet flow for the flow of liquid based on the power consumption levels of the computing devices.

15. The computer program product of claim 10, wherein allocating processing workload among the first computing device and the second computing device comprises allocating an increased amount of workload to the first computing device based on the first dynamic cooling capacity index being greater than the second dynamic cooling capacity index.

16. The computer program product of claim 10,
wherein allocating processing workload among the first computing device and the second computing device comprises allocating processing workload further based on an instant power consumption for each of the first and second computing devices and an instant flow rate of the liquid for each of the first and second computing devices.

17. The computer program product of claim 10, wherein the first and second dynamic heat transfer indexes each comprise a function of an instant power consumption and a predetermined power level for the respective computing device.

18. The computer program product of claim 10, wherein the first and second dynamic cooling capacity indexes are each configured to represent the instant capacity of the respective computing device to dissipate additional processing power into heat in the flow of liquid, from a range of values comprising a full cooling capacity value and a zero cooling capacity value.

* * * * *